US012731977B2

(12) United States Patent
Nuebling

(10) Patent No.: US 12,731,977 B2
(45) Date of Patent: Sep. 8, 2026

(54) DRIVER STAGE SELECTION BASED ON NOISE IN GALVANIC ISOLATION SIGNAL TRANSMISSION

(71) Applicant: Infineon Technologies AG, Neubiberg (DE)

(72) Inventor: Marcus Nuebling, Olching-Esting (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 18/774,641

(22) Filed: Jul. 16, 2024

(65) Prior Publication Data

US 2026/0024980 A1 Jan. 22, 2026

(51) Int. Cl.
*H02H 1/00* (2006.01)
*G01R 19/165* (2006.01)

(52) U.S. Cl.
CPC ....... *H02H 1/0007* (2013.01); *G01R 19/1659* (2013.01)

(58) Field of Classification Search
CPC ...... H02H 1/00; H02H 1/0007; G01R 19/165; G01R 19/1659; H03K 7/06; H03K 17/16; H03H 7/42; H03H 7/01
USPC ...................................................... 361/86–87
See application file for complete search history.

(56) References Cited

U.S. PATENT DOCUMENTS

2014/0169038 A1* 6/2014 Kamath .................. H03D 3/00 363/16
2024/0333247 A1* 10/2024 Horan .................. H03K 17/162

OTHER PUBLICATIONS

"Galvanic Isolated Gate Driver", Retrieved from:https://www.infineon.com/cms/en/product/power/gate-driver-ics/galvanic-isolated-gate-driver/#!documents; Accessed on Oct. 20, 2023, 21 pp.

* cited by examiner

*Primary Examiner* — Danny Nguyen
(74) *Attorney, Agent, or Firm* — Shumaker & Sieffert, P.A.

(57) ABSTRACT

According to this disclosure, a first driver circuit may be configured to output a first signal, and a second driver circuit configured to output a second signal, wherein the first signal and the second signal define the differential signal, e.g., for communication over a galvanic isolation barrier. In order to reduce power consumption and also facilitate effective communication in the presence of noise, each driver circuit may include multiple driver stages, and each driver circuit may be capable of using different driver stages at different instances of time, e.g., to change from a low power mode to high power mode, when necessary or desirable. The change from low power mode to high power mode, for example, may be based on detected noise on the communication channels.

21 Claims, 6 Drawing Sheets

DRIVER STAGE SELECTION BASED ON NOISE IN GALVANIC ISOLATION SIGNAL TRANSMISSION

TECHNICAL FIELD

The disclosure relates to circuits that perform differential-signal transmission over a galvanic isolation barrier.

BACKGROUND

Some circuits or devices may include an isolation barrier between different circuitry such as, for example, digital circuitry and high voltage circuitry. The isolation barrier, for example, may comprise a galvanic isolation barrier that separates the circuits in two different voltage domains. Some examples of circuits with an isolation barrier may include power switch driver circuits, coupler circuits, circuits that operate in different voltage domains, and other types of circuits. Modern vehicles, or example, may use many different circuits separated by a galvanic isolation barrier.

In some examples, such circuits may include isolated differential-signal transmission circuitry or other elements for communication of commands, data, status, alerts, and similar messages across the isolation barrier.

SUMMARY

In general, the disclosure describes circuits, devices and systems that are configured to generate a differential signal for communication over a galvanic isolation barrier. In some examples, the galvanic isolation barrier is formed with capacitors arranged in two different communication channels associated with the differential signal. According to this disclosure, a first driver circuit may be configured to output a first signal, and a second driver circuit configured to output a second signal, wherein the first signal and the second signal define the differential signal. In order to reduce power consumption and also facilitate effective communication in the presence of noise, each driver circuit may include multiple driver stages, and each driver circuit may be capable of using different driver stages at different instances of time, e.g., to change from a low power mode to high power mode, when necessary or desirable. The change from low power mode to high power mode, for example, may be based on detected noise on the communication channels.

A common mode transient sensor is also described, which may be configured to detect whether the common mode transient event exists or whether no common mode transient event exists. In these examples, a processor or logic unit may be configured to select the desirable driver stages from the different driver stages of the driver circuits based on output from the common mode transient sensor. Other desirable features for a common mode transient sensor are also described.

In some examples, this disclosure describes a circuit configured to generate a differential signal for communication over a galvanic isolation barrier, the circuit comprising: a first driver circuit configured to output a first signal, and a second driver circuit configured to output a second signal, wherein the first signal and the second signal define the differential signal. The first driver circuit may include a first driver stage (e.g., a large driver stage) and a second driver stage (e.g., a small driver stage), wherein an output impedance of the first driver stage is lower than an output impedance of the second driver stage. The second driver circuit may include a third driver stage (e.g., another large driver stage) and a fourth driver stage (e.g., another small driver stage), wherein an output impedance of the third driver stage is lower than an output impedance of the fourth driver stage. The circuit is configured to: generate the differential signal using the second driver stage and the fourth driver stage in response to detecting no common mode transient event; and generate the differential signal using the first driver stage and the third driver stage in response to detecting a common mode transient event.

In some examples, this disclosure describes a method that comprises outputting a first signal via a first driver circuit; and outputting a second signal via a second driver circuit, wherein the first signal and the second signal define the differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage. The method further includes: generating the differential signal using the second driver stage and the fourth driver stage in response to detecting no common mode transient event; and generating the differential signal using the first driver stage and the third driver stage in response to detecting a common mode transient event.

In some examples, this disclosure describes a system that comprises a transmitter circuit; a receiver circuit; and a plurality of capacitors that define a galvanic isolation barrier between the transmitter circuit and the receiver circuit. The transmitter circuit is configured to generate a differential signal for communication over the galvanic isolation barrier. The transmitter circuit may comprise a first driver circuit configured to output a first signal, and a second driver circuit configured to output a second signal, wherein the first signal and the second signal define the differential signal, wherein the first driver circuit includes a first driver stage and a second driver stage, wherein an output impedance of the first driver stage is lower than an output impedance of the second driver stage, and wherein the second driver circuit includes a third driver stage and a fourth driver stage, wherein an output impedance of the third driver stage is lower than an output impedance of the fourth driver stage. The transmitter circuit may be configured to: generate the differential signal using the second driver stage and the fourth driver stage in response to detecting no common mode transient event; and generate the differential signal using the first driver stage and the third driver stage in response to detecting a common mode transient event.

The details of one or more examples of the disclosure are set forth in the accompanying drawings and the description below. Other features, objects, and advantages of the disclosure will be apparent from the description and drawings, and from the claims.

DETAILED DESCRIPTION

In order to reduce power consumption and also facilitate effective communication over a galvanic isolation barrier in the presence of noise, driver circuits may be configured to include multiple driver stages. A driver circuit may be capable of using different driver stages at different instances of time, e.g., to change from a low power mode to high power mode when necessary or desirable. The change from low power mode to high power mode, for example, may be based on detected noise on the communication channels. In this way, communication over a galvanic isolation barrier may be improved in the presence of noise on the communication channel, while also minimizing or reducing power consumption by the driver circuit in the absence of noise on the communication channel.

Circuits with galvanic isolation are increasingly demanded in electric vehicles. Low power is desirable for such circuits. At the same time, for some power switches used in vehicles e.g., metal oxide semiconductor field effect transistors (MOSFETs) formed in silicon carbide (SiC) or gallium nitride (GaN), the common mode transient immunity specifications are also increasing.

One useful method for data transmission over a galvanic isolation is communication using differential ON-OFF shift keying (OOK). Designing low-power circuits with galvanic isolation capabilities and differential OOK communication capabilities over the galvanic isolation barrier is increasingly difficult, as the circuits may be sensitive to common mode transients, which are also increasing especially with the use of SiC and GaN technologies. The circuits and methods of this disclosure may achieve a low power design using a differential OOK transmission that also delivers a high common mode transient immunity (CMTI).

In some circuit designs, the main current consumption in a differential OOK may be wasted in the driver circuits. The current consumption may increase by increasing the RF carrier frequency, which may be needed when relatively small capacitors are used for galvanic isolation. Current consumption also increases when the size of the power stage is increased (e.g., more parasitic capacitances must be charged, and cross conduction may be present when the circuit is used in an inverter for a three-phase electric motor). On the other hand, the size (e.g., power strength) of the output stage may need to be large enough for sinking or sourcing the complete displacement current associated with common mode disturbances.

Figure 1:
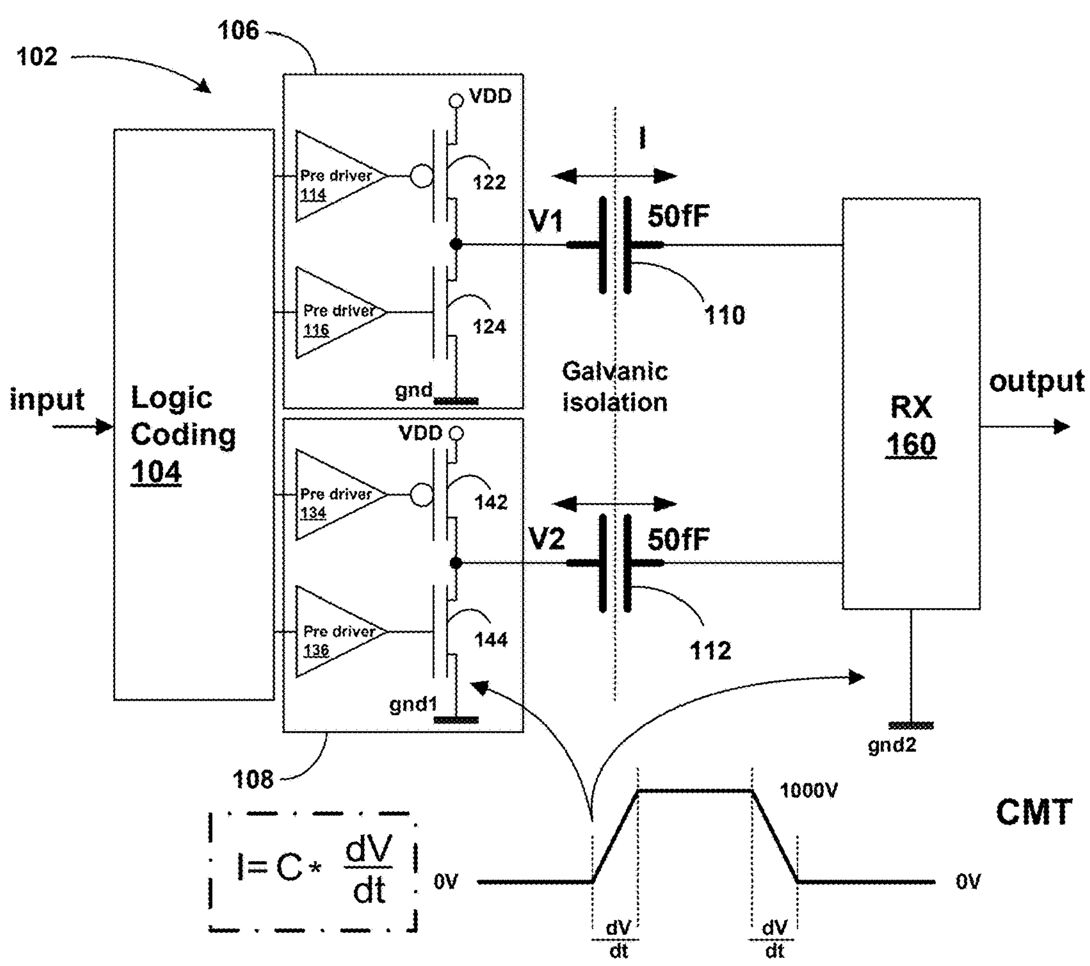
FIG. 1 is a block and circuit diagram illustrating an example system for communicating information over a galvanic isolation barrier.
Figure 2:
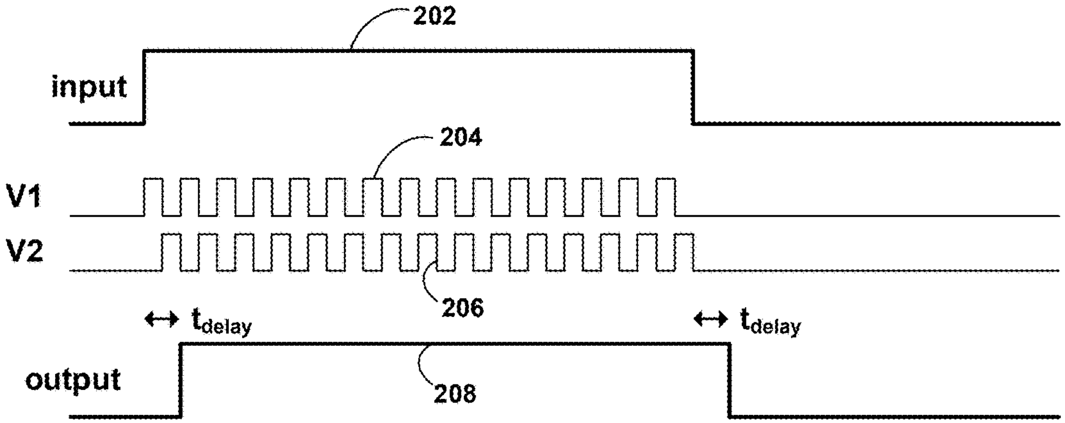
FIG. 2 is a set of graphs showing and input signal, two parts of a differential signal, and an output signal.

FIG. 1 is a block and circuit diagram illustrating an example system for communicating information over a galvanic isolation barrier. The system shown in FIG. 1 comprises a transmitter circuit 102 and a receiver circuit 160. FIG. 2 is a set of graphs showing and input signal 202, two parts of a differential signal 204, 206, and an output signal 208. Output signal 208 is similar to input signal 202, but output signal 208 is delayed by ($t_{delay}$) relative to input signal 202. The amount of time $t_{delay}$ may be due to the encoding and decoding of differential signal 204, 206.

A logic coding unit 104 may comprise logic elements or a processor that is configured to define a differential OOK signal based on an input signal 202. Logic 104 may be configured to control a first driver circuit 106 and second driver circuit 108 to generate differential signal 204, 206, which can be transmitted over capacitors 110, 112 due to the high frequency of differential signal 204, 206. Capacitors 110, 112 create a galvanic isolation barrier for DC voltages and low frequency voltages, but capacitors 110, 112 may form high-pass filters such that differential signal 204, 206 can be received and decoded by receiver circuit 160. In some examples, even relatively small capacitors, e.g., in the range of 50 femtofarads (fF) may be sufficient for galvanic isolation of some automotive circuits.

First driver circuit 106 may comprise a high-side power switch 122 and a low-side power switch 124 that are controlled to create V1 204 for communication across capacitor 110. For example, pre-driver 114 may control a gate of high-side power switch 122 and pre-driver 116 may control a gate of low-side power switch 124 so as to generate V1 204 for communication across capacitor 110. In some examples, high-side power switch 122 comprises a PMOS power switch and low-side power switch 124 comprises an NMOS power switch. Pre-drivers 114, 116 may comprise any circuit configured to generate the appropriate gate control signals for power switches 122, 124, such as a regulator, DC/DC converter, or other gate control circuit.

Second driver circuit 108 is similar to first driver circuit 106. Second driver circuit 108 may comprise a high-side power switch 142 and a low-side power switch 144 that are controlled to create V2 206 for communication across capacitor 112. For example, pre-driver 134 may control a gate of high-side power switch 142 and pre-driver 136 may control a gate of low-side power switch 144 so as to generate V2 206 for communication across capacitor 112. In some examples, high-side power switch 142 comprises a PMOS power switch and low-side power switch 144 comprises an NMOS power switch. Pre-drivers 134, 136 may comprise any circuit configured to generate the appropriate gate control signals for power switches 142, 144, such as a regulator, DC/DC converter, or other gate control circuit.

In some examples, this disclosure describes an additional common mode transient sensor for a circuit like that shown in FIG. 1, e.g., in order to sense the common mode displacement current over the galvanic isolation barrier. Moreover, this disclosure describes driver circuits that include different output stages, e.g., a high-power output stage and a low power output stage for each driver circuit. If a common mode displacement current is detected, a driver circuit may be controlled to switch its output stage from a low power mode to a high-power mode, which increases the output driver strength. By this, the average current consumption may be reduced while still have a high common mode transient immunity.

Figure 3:
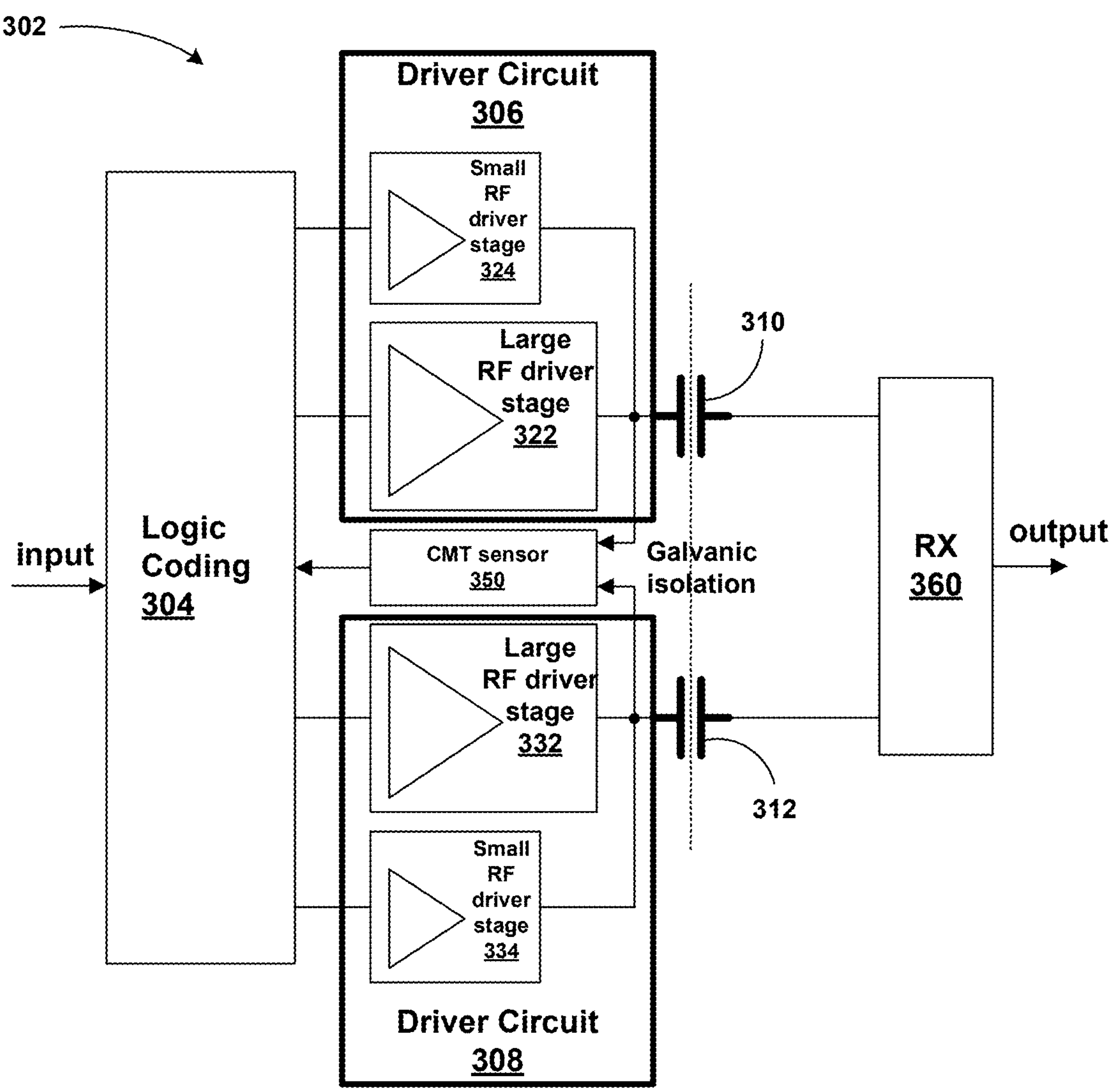
FIG. 3 is a block diagram showing an example system for communicating information over a galvanic isolation barrier consistent with this disclosure.

FIG. 3 is a block diagram showing an example system for communicating information over a galvanic isolation barrier consistent with this disclosure. The system of FIG. 3 may comprise a transmitter circuit 302, a receiver circuit 360 and a plurality of capacitors 310, 312 that define a galvanic isolation barrier between transmitter circuit 302 and receiver circuit 360. Transmitter circuit 302 and receiver circuit 360, for example, may operate in different voltage domains and the communication over the galvanic isolation barrier may be desirable to exchange control information, information about other circuits in the respective voltage domains, or any desirable information that may be used by circuits located on different sides of the galvanic isolation barrier. A differential signal (e.g., like 204, 206) may be communicated thorough capacitors 310, 312 from transmitter circuit 302 to receiver circuit 360.

Transmitter circuit 302 is one example of a circuit configured to generate a differential signal for communication over a galvanic isolation barrier. Transmitter circuit 302 comprises a first driver circuit 306 configured to output a first signal, e.g., to capacitor 310. Transmitter circuit 302 also comprises a second driver circuit 308 configured to output a second signal, e.g., to capacitor 312. The first signal and the second signal may define the differential signal, e.g., similar to that shown in FIG. 2 with signal 204 corresponding to the first signal and signal 206 corresponding to the second signal.

According to some examples of this disclosure, first driver circuit 306 includes a first driver stage 322 and a second driver stage 324. First driver stage 322 may be larger than second driver stage 324. Moreover, in some examples, an output impedance of first driver stage 322 is lower than an output impedance of second driver stage 324. Second driver circuit 308 may be similar to first driver circuit 306. For example, second driver stage 308 may include a third driver stage 332 and a fourth driver stage 334, wherein an output impedance of third driver stage 332 is lower than an output impedance of fourth driver stage 334.

Transmitter circuit 302 may be configured to generate the differential signal (e.g., 204, 206 of FIG. 2) using second driver stage 324 and fourth driver stage 334 in response to detecting no common mode transient event. In addition, transmitter circuit 302 may be configured and generate the differential signal (e.g., 204, 206 of FIG. 2) using first driver stage 322 and third driver stage 332 in response to detecting a common mode transient event.

Again, in some examples, first driver stage 322 is larger than second driver stage 324. For example, first driver stage 322 may consume more power than second driver stage 324, and first driver stage 322 may dissipate more heat than second driver stage 324. Similarly, third driver stage 332 may be larger than fourth driver stage 334, third driver stage 332 may consume more power than fourth driver stage 334, and third driver stage 332 may dissipate more heat than fourth driver stage 334.

In some examples, first driver stage 322 and third driver stage 332 may be capable of "high driving capability" whereas second driver stage 324 and third driver stage 334 may only be capable of "low driving capability." In some examples, the voltage driving capabilities may be different between two different driver stages of a driver.

In some examples, first driver stage 322 and third driver stage 332 may be configured for high voltage driving capability whereas second driver stage 324 and fourth driver stage 334 may be configured for low voltage driving capability. In other words, first driver stage 322 and third driver stage 332 may operate at higher voltages than the operational voltages associated with second driver stage 324 and fourth driver stage 334.

In these or other examples, first driver stage 322 and third driver stage 332 may also be configured for high current driving capability whereas second driver stage 324 and fourth driver stage 334 may be configured for low current driving capability. In other words, in current control situations and examples, first driver stage 322 and third driver stage 332 may operate to deliver higher currents than those delivered by second driver stage 324 and fourth driver stage 334.

So-called "BCD-Technology" (where BCD refers to Bipolar Cmos Dmos) is an example technology where the strength of the driver stage is a function of the devices which are being used. In such applications consistent with BCD-Technology, according to this disclosure, a "large driver stage" could be built out of bipolar transistors a "small driver stage" could be built out of cmos transistors. Thus, in some examples consistent with BCD-technology, first driver stage 322 and third driver stage 332 may comprise bipolar transistors and second driver stage 324 and fourth driver stage 334 may comprise Cmos transistors.

In some examples, transmitter circuit 302 includes a common mode transient (CMT) sensor 350 configured to detect whether a common mode transient event exists or whether no common mode transient event exists. In this case, logic coding unit 304 (or a processor) may perform the selection of first and third driver stages 322, 332 or the selection of second and fourth driver stages 324, 334 based on the output of CMT sensor 350 indicating the presence or absence of a common mode transient event. Thus, a processor or logic coding unit 304 may be configured to select either the first and third driver stages 322, 332 or the second and fourth driver stages 324, 334 based on output from the common mode transient sensor.

In some examples, CMT sensor 350 comprises a first set of PMOS and NMOS transistors, and a second set of PMOS and NMOS transistors, wherein each of the PMOS transistors is sized differently than each of the NMOS transistors and wherein relative sizes of the PMOS and NMOS transistors in the first set defines a high voltage reference point for CMT sensor 350 and relative sizes of the PMOS and NMOS transistors in the second set defines a low voltage reference point for CMT sensor 350.

In some examples, CMT sensor 350 comprises a first set of PMOS and NMOS transistors, and a second set of PMOS and NMOS transistors, wherein the first set of PMOS and NMOS transistors are arranged and controlled to define a high voltage reference point the common mode transient sensor, and wherein the second set of PMOS and NMOS transistors are arranged and controlled to define a low voltage reference point the common mode transient sensor. For example, different duty cycles may be used or different arrangements may be used to define a high voltage reference point and a voltage reference point. Additional details and some additional examples of using CMT sensor design for generating a high voltage reference point and a low voltage reference point are discussed below.

Regardless of how the high voltage reference point and a low voltage reference point are defined, in various examples, CMT sensor 350 may be configured to determine that the common mode transient event exists in response to detecting a voltage signal that is above the high voltage reference point or below the low voltage reference point. The voltage signal, in this example, may comprise a mid-voltage signal that is based on the first signal and the second signal that define the differential signal.

In some examples consistent with FIG. 3, first driver stage 322 may include a first high side transistor and a first low side transistor, second driver stage 324 may include a second high side transistor and a second low side transistor, third driver stage 332 may include a third high side transistor and a third low side transistor, and fourth driver stage 334 may include a fourth high side transistor and a fourth low side transistor.

In some examples, a method of operating transmitter circuit 302 may comprise outputting a first signal (e.g., 204) via a first driver circuit 306, and outputting a second signal (e.g., 206) via a second driver circuit 308, wherein first signal 204 and second signal 206 define the differential signal. First driver circuit 306 may include a first driver stage 322 and a second driver stage 324, wherein an output impedance of first driver stage 322 is lower than an output impedance of second driver stage 324. Second driver circuit 308 may include a third driver stage 332 and a fourth driver stage 334, wherein an output impedance of third driver stage 332 is lower than an output impedance of fourth driver stage 334. In some examples, a method executed by transmitter circuit 302 may comprise generating a differential signal using second driver stage 324 and fourth driver stage 334 (e.g., the small driver stages) in response to detecting no common mode transient event, and generating the differential signal using first driver stage 322 and third driver stage 332 (e.g., the large driver stages) in response to detecting a common mode transient event.

Detecting whether the common mode transient event exists or whether no common mode transient event exists may be performed via CMT sensor 350. Transmitter circuit 302 (e.g., logic coding unit of circuit 302) may be configured to select either the first and third driver stages 322, 332 or the second and fourth driver stages 324, 334 based on output from CMT sensor 350.

Figure 4:
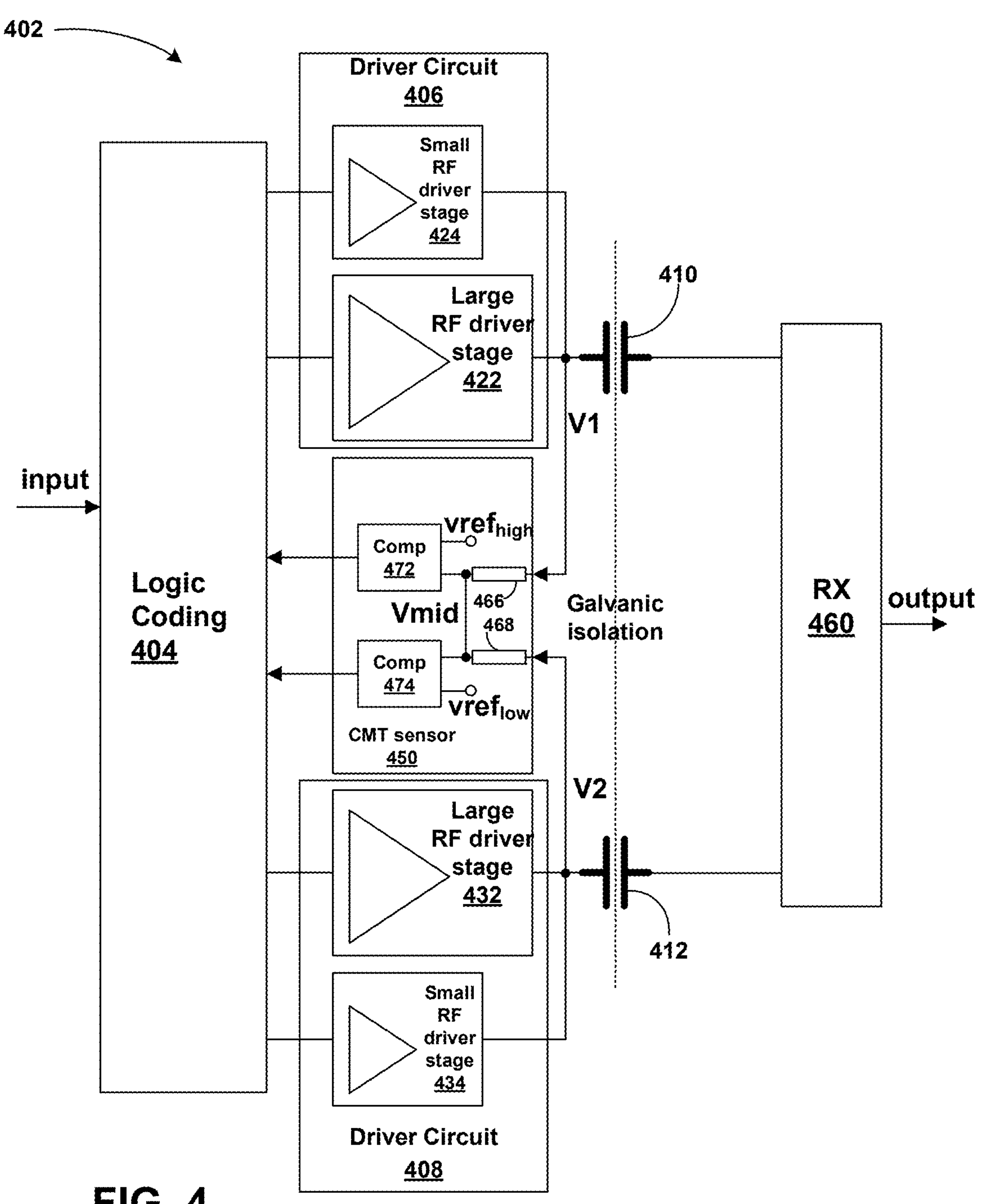
FIG. 4 is another block diagram showing an example system for communicating information over a galvanic isolation barrier consistent with this disclosure.

FIG. 4 is another block diagram showing an example system for communicating information over a galvanic isolation barrier consistent with this disclosure. The example system shown in FIG. 4 is similar to the system of FIG. 3 in many respects and may operate as described above with regard to FIG. 3.

In some examples, transmitter circuit 402 of FIG. 4 is similar to transmitter circuit 302 of FIG. 3, and receiver circuit 460 is similar to receiver circuit 360. Logic coding unit 404 may be similar to logic coding unit 304, and capacitors 410, 412 may be similar to capacitors 310, 312. Capacitors 410, 412 are positioned between transmitter circuit 402 and receiver circuit 460, wherein a differential signal is communicated thorough the capacitors from transmitter circuit 402 to receiver circuit 460. First driver stage 422 and second driver stage 424 of first driver circuit 406 are similar to first driver stage 322 and second driver stage 324 of first driver circuit 306, and third driver stage 432 and fourth driver stage 434 of second driver circuit 408 are similar to third driver stage 324 and fourth driver stage 334 of second driver circuit 308.

CMT sensor 405 of transmitter circuit 402 may be configured to determine whether a common mode transient event exists, and logic coding unit 404 may be configured to select the driving stages of first and second driver circuits 406, 408. In particular, CMT sensor 450 may be configured to detect whether a voltage signal (e.g., one or both of the voltage signals on the transmitter side of capacitors 410, 412 is above or below a threshold. In the illustrated configuration, CMT sensor 450 may be configured to compare a voltage signal to both a high voltage reference point and a low voltage reference point, and a common mode transient event may be identified if the voltage signal is above the high voltage reference point or below the low voltage reference point.

CMT sensor 405 may comprise resistors 466, 468 to scale down the voltages on the output nodes of capacitors 410, 412 (e.g., on the galvanically isolated transmitter side of capacitors 410, 412) in order to define voltage signals. Comparator circuits 472, 474 comprise comparators or other comparison circuits respectively configured to compare a voltage signal to a high reference point ($Vref_{high}$) and a low reference point ($Vref_{low}$). In this case, the voltage signal may comprise a mid-voltage signal that is based on the first signal and the second signal that define the differential signal.

Figure 5:
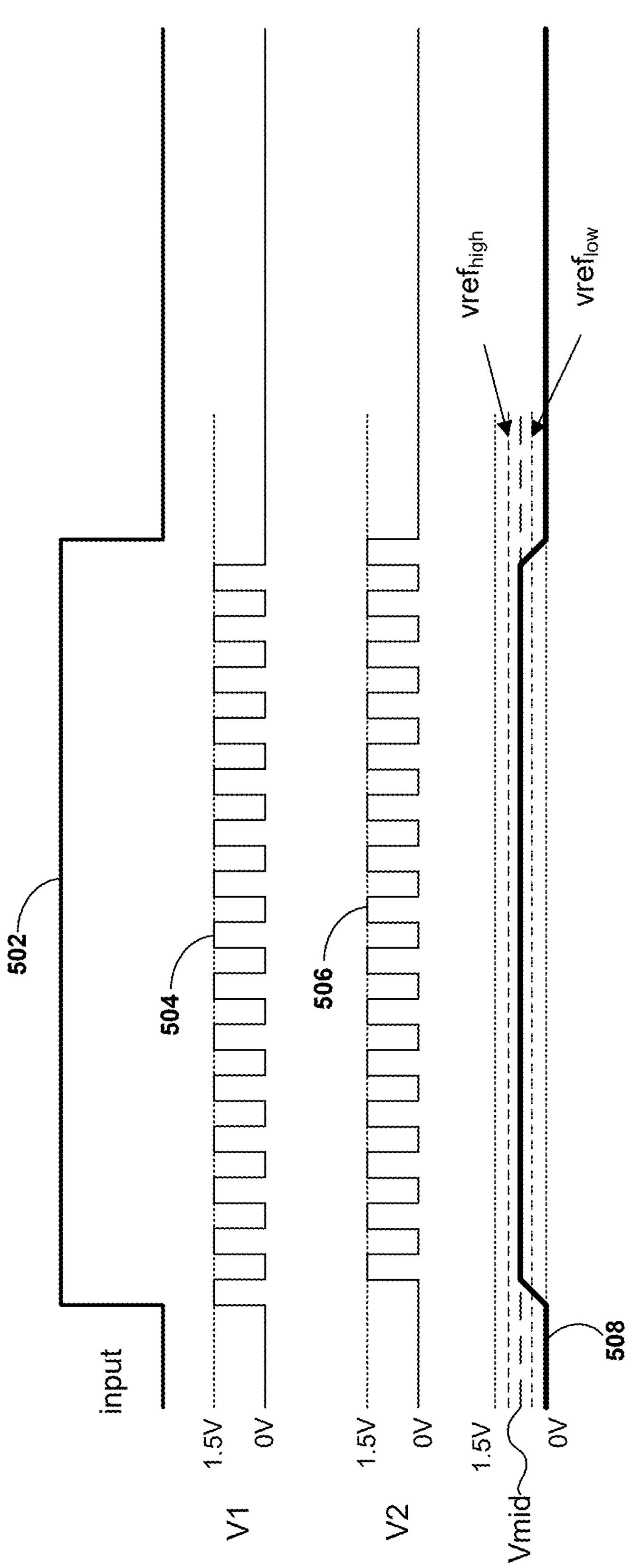
FIG. 5 is a set of graphs showing and input signal, two parts of a differential signal and a graph showing high and low voltage references relative to a voltage midpoint.

FIG. 5 is a set of graphs showing and input signal, two parts of a differential signal and a graph showing high and low voltage references relative to a voltage midpoint. FIG. 5 is consistent with one exemplary operation of transmitter circuit 402 and CMT sensor 405 shown in FIG. 4.

Signal 502 represents an input signal to logic coding unit 404 to be communicated by transmitter circuit 402 to receiver circuit 460 over a differential galvanic isolation barrier. Signal 504 represents a first signal output by first driver circuit 406. Signal 506 represents a second signal output by second driver circuit 408. The first signal 504 and the second signal 506 define the differential signal communicated over capacitors 410, 412.

In some examples, signal 508 corresponds to the voltage signal that is generated by CMT sensor 450 based on the output signals of driver circuits 406, 408. In particular, signal 508 may correspond to the input signal to comparison circuits 472, 474.

Comparison circuit 472 compares signal 508 to a high signal ($Vref_{high}$) that is higher than a midpoint, and comparison circuit 474 compares signal 508 to a low signal ($Vref_{low}$) that is higher than the midpoint. The values of $Vref_{high}$ and $Vref_{low}$ are defined or selected to identify a common mode transient event whenever signal 508 is above $Vref_{high}$ or below $Vref_{low}$. Moreover, in response to CMT sensor 550 identifying a common mode transient event, logic coding unit 404 may be configured to command driver circuits 406, 408 to switch from low power output stages (e.g., second and fourth stages 424, 434) to high power output stages (e.g., first and third stages 422, 432).

Figure 6:
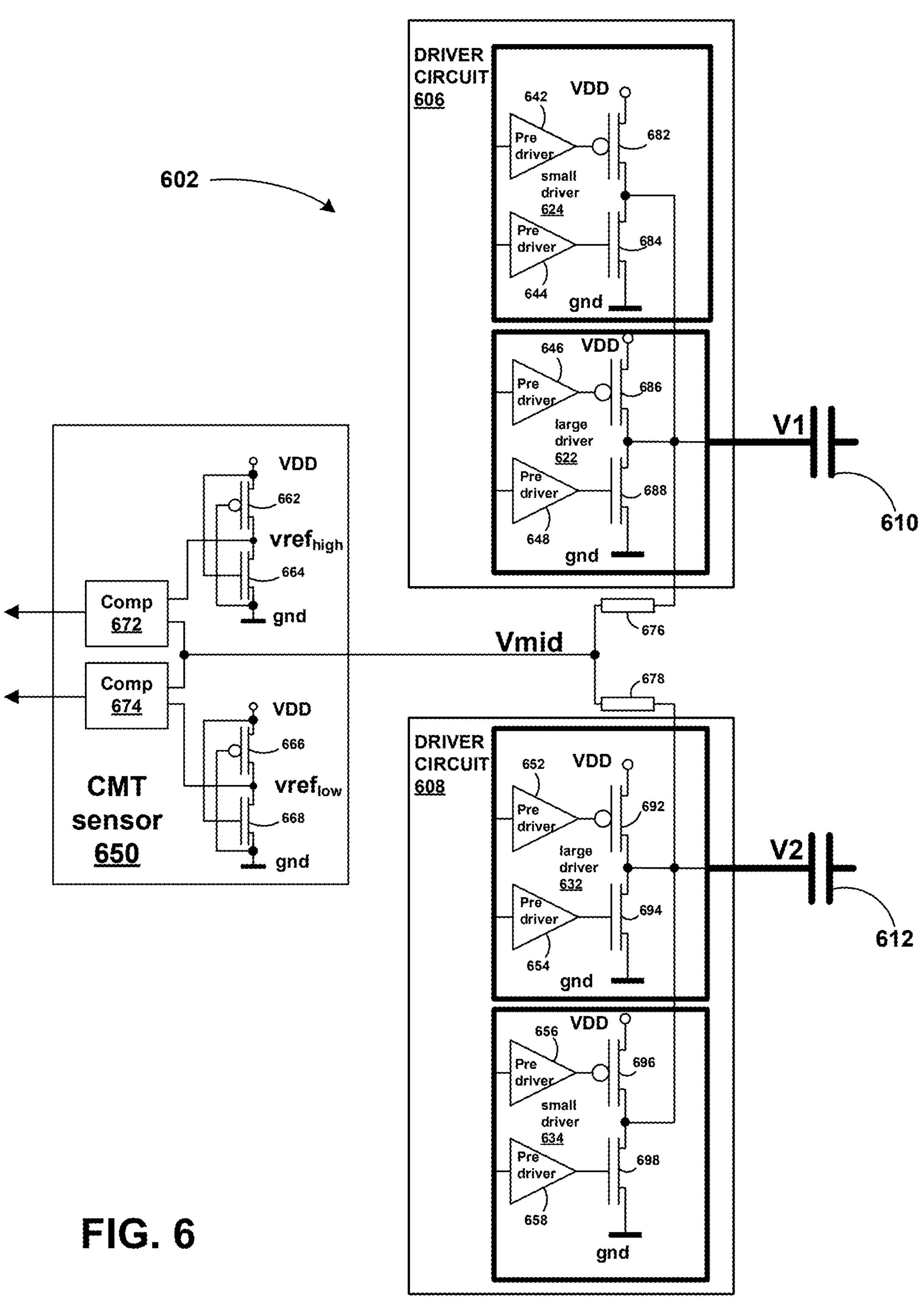
FIG. 6 is a block and circuit diagram showing an example circuit for communicating information over a galvanic isolation barrier consistent with this disclosure.

FIG. 6 is a block and circuit diagram showing an example transmitter circuit 602 for communicating information over a galvanic isolation barrier consistent with this disclosure. Transmitter circuit 602 shown in FIG. 6 is one more specific example of a transmitter circuit 302 of FIG. 3 or transmitter circuit 402 of FIG. 4. Accordingly, transmitter circuit 602 shown in FIG. 6 may operate as described above with regard to transmitter circuits 302, 402 of FIGS. 3 and 4.

Capacitors 610, 612 positioned on a galvanic isolation barrier between circuit 602 and a receiver circuit (not shown). A differential signal is communicated thorough the capacitors from transmitter circuit 602 to the receiver circuit. First driver stage 622 and second driver stage 624 of first driver circuit 606 may operate similarly to first driver stage 322, 422, and second driver stage 324, 424 of first driver circuit 306, 406 (as discussed above), and third driver stage 632 and fourth driver stage 634 of second driver circuit 608 may operate similarly to third driver stage 324, 424 and fourth driver stage 334, 434 of second driver circuit 308, 408 (as discussed above).

More specifically, in the example of FIG. 6, driver stage 622 comprises a high-side transistor 686 and a low side-side transistor 688 arranged in a half-bridge. High-side transistor 686 may comprise a PMOS transistor and low-side transistor 688 may comprise an NMOS transistor. Moreover, the sizes of high-side transistor 686 and low-side transistor 688 may be selected to achieve the desired voltage and current levels on the switch node between high-side transistor 686 and a low side-side transistor 688. Pre-driver circuits 646, 648 may be configured to define the proper gate voltages (or currents) to the gates of transistors 686, 688, e.g., as directed by a control logic or processor.

The other driver stages (e.g., 624, 632, and 634) may be configured similarly to driver stage 622 and comprise a high-side transistor 682, 692, 696 and a low side-side transistor 684, 694, 698 arranged in a half-bridge. High-side transistor 682, 692, 696 may comprise a PMOS transistor and low-side transistor 684, 694, 698 may comprise an NMOS transistor. Moreover, the sizes of high-side transistor 682, 692, 696 relative to low-side transistor 684, 694, 698 may be selected to achieve the desired voltage and current levels on the switch node between each respective half-bridge. Pre-driver circuits 642, 644, 652, 654, 656, 658 may be configured to define the proper gate voltages (or currents) to the gates of transistors 682, 684, 692, 694, 696, 698 e.g., as directed by a control logic or processor.

In some examples, driver stages 622, 624, 632, 634 define output profiles according to the ratio:

$$\frac{w/l(Pmos)}{w/l(Nmos)} = 2$$

Where "w" refers to the width of a mos transistor (e.g., the Nmos or Pmos transistor), and "l" refers to the length of the mos transistor. A higher w/l ratio results in more power delivery by the mos transistor. In other words, the higher the w/l ratio, the lower the output driving impedance of the MOS transistor.

The example system shown in FIG. 6 also demonstrates one more specific example of a CMT sensor 650. Resistors 676, 678 sample the voltages on the active switch node of driver circuit 606 and driver circuit 608 to define a reference volage. In the case shown in FIG. 6 where the switch node voltages are similar and resistors 676, 678 are similarly sized, the voltage can be defined as Vmid such as that illustrated in FIG. 5.

CMT sensor 650 comprises a first set of PMOS and NMOS transistors 662, 664, and a second set of PMOS and NMOS transistors 666, 668, wherein each of the PMOS transistors 662, 666 is sized differently than each of the NMOS transistors 664, 668 so as to define a high voltage reference point ($Vref_{high}$) and a low voltage reference ($Vref_{low}$) point for CMT sensor 650, e.g., as shown in FIG. 5. In other words, the relative sizing of PMOS and NMOS transistors 662, 664 and the relative sizing of PMOS and NMOS transistors 666, 668 can be used to define high voltage reference point ($Vref_{high}$) and a low voltage reference ($Vref_{low}$). For example, the relative sizing of PMOS and NMOS transistors 662, 664 and the relative sizing of PMOS and NMOS transistors 666, 668 may be defined according to the transfer function:

$$\frac{w/l(Pmos)}{w/l(Nmos)} = 10$$

In other examples, PMOS and NMOS transistors 662, 664 may be controlled to define high voltage reference point ($Vref_{high}$), and PMOS and NMOS transistors 666, 668 may be controlled to define high voltage reference point ($Vref_{low}$), e.g., by controlling duty cycles and relative sizing of the transistors. In this case, CMT sensor 650 the first set of PMOS and NMOS 662, 664 may be arranged and controlled to define a high voltage reference point (e.g., $Vref_{high}$) and the second set of PMOS and NMOS transistors 666, 668 may be arranged and controlled to define the low voltage reference point (e.g., $Vref_{low}$). Controlling duty cycles may add a level of undesired complexity, and therefore, in some examples, the relative sizing of transistors may be used (without adjusting or controlling duty cycles) in order to define the reference points.

A processor or logic may be configured to determine that a common mode transient event exists in response to CMT sensor 650 detecting a voltage signal that is above the high voltage reference point or below the low voltage reference point. The voltage signal may comprise a mid-voltage signal (e.g., signal 508) that is based on a first signal (e.g., 506) and a second signal (e.g., 508) that define a differential signal.

Figure 7:
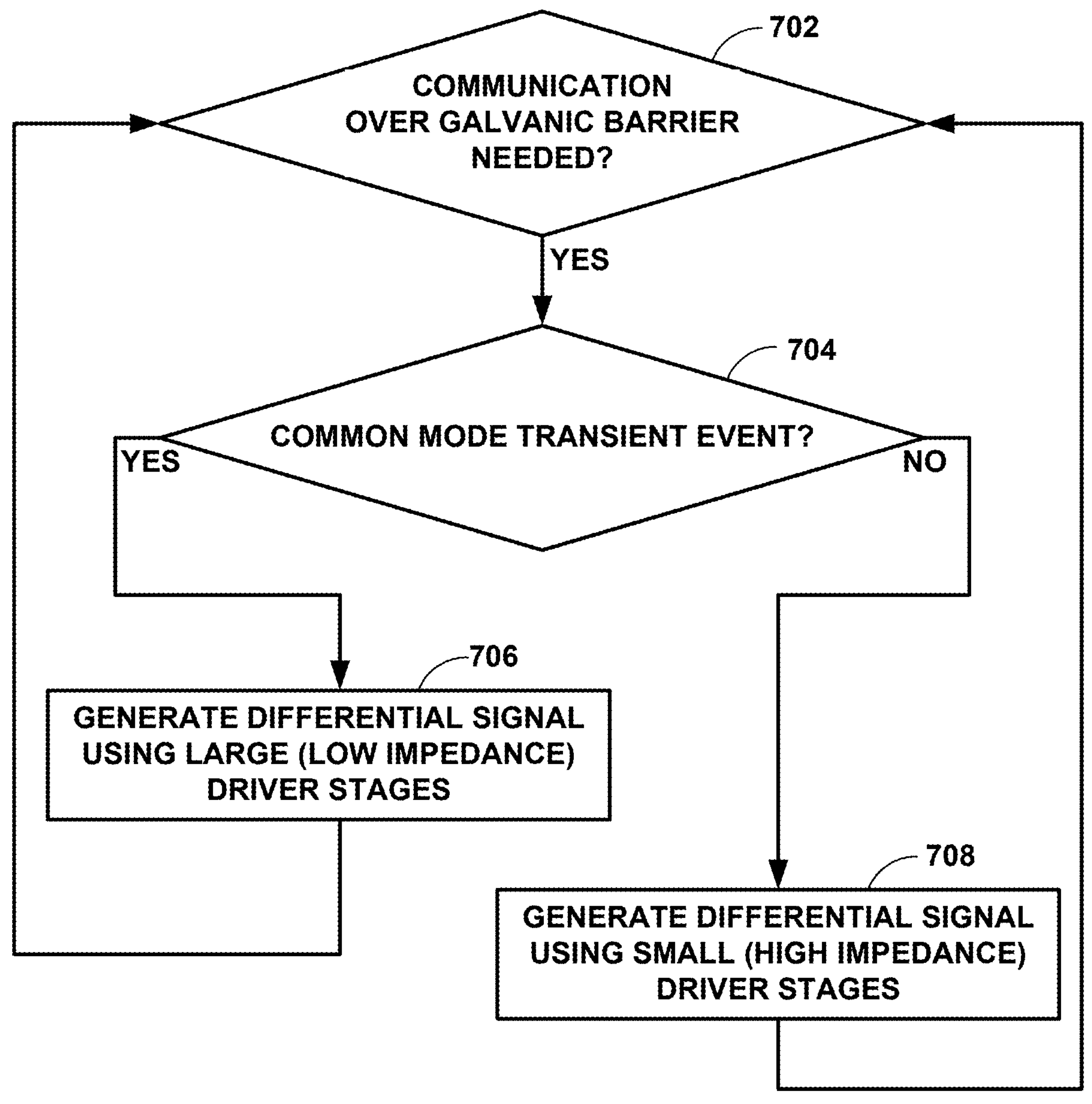
FIG. 7 is a flow diagram showing an example method consistent with this disclosure.

FIG. 7 is a flow diagram illustrating a method consistent with this disclosure. The method of FIG. 7 will be described from the perspective of any logic coding unit 304 or 404 although a variety of other devices, processors, automotive microcontroller ("MCUs"), or circuits could also perform the method. Logic coding unit 304, 404 in the following description of FIG. 7 may refer to logic, a processor, and MCU, or any circuit that could perform the method of FIG. 7.

Logic coding unit 304, 404 may determine whether communication over a galvanic isolation barrier is needed (701), e.g., based on a command or request from a system-level processor. When communication over a galvanic isolation barrier is needed ("Yes" 701). Logic coding unit 304, 404 identifies whether a common mode transient event is present on the differential communication channel (704). When a common mode transient event is present on the differential communication channel ("yes" 704), logic coding unit 304, 404 causes driver circuits 306, 308, 406, 408 to generate differential signals using large (low impedance) driver stages (706). In particular, in response to a common mode transient event is present on the differential communication channel ("yes" 704), logic coding unit 304, 404 causes driver circuits 306, 308, 406, 408 to generate differential signals using large driver stages 322, 332, 422, 432. In various examples, logic coding unit 304, 404 may determine whether a common mode transient event is present on the differential communication channel (704) based on output from CMT sensor 350, 450 as described herein.

In contrast, when no common mode transient event is present on the differential communication channel ("no" 704), logic coding unit 304, 404 causes driver circuits 306, 308, 406, 408 to generate differential signals using small (high impedance) driver stages (708). In particular, in response to no common mode transient event being present on the differential communication channel ("no" 704), logic coding unit 304, 404 causes driver circuits 306, 308, 406, 408 to generate differential signals using large driver stages 324, 334, 424, 434.

The techniques described in this disclosure may be implemented in circuitry. In various examples, the techniques may be implemented, at least in part, in circuitry, hardware, software, firmware or any combination thereof. For example, various aspects of the described techniques may be implemented within one or more logical elements, processors, including one or more microcontrollers, microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such circuitry, hardware, software, and firmware may be implemented within the same device or integrated circuit or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, e.g., especially for logic or decisions that are preformed based on circuit output, in which case those aspects of the techniques described in this disclosure may also be embodied or encoded in a computer-readable medium, such as a computer-readable storage medium, containing instructions. Instructions embedded or encoded in a computer-readable storage medium may cause a processor, to perform the method, e.g., when the instructions are executed. The instructions, in this example, may be stored in a memory, which may comprise random access memory (RAM), read only memory (ROM), programmable read only memory (PROM), erasable programmable read only memory (EPROM), electronically erasable programmable read only memory (EEPROM), flash memory, or other computer readable media.

The techniques of this disclosure may also be described in the following clauses.

Clause 1: A circuit configured to generate a differential signal for communication over a galvanic isolation barrier, the circuit comprising: a first driver circuit configured to output a first signal, and a second driver circuit configured to output a second signal, wherein the first signal and the second signal define the differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage, wherein the circuit is configured to: generate the differential signal using the second driver stage and the fourth driver stage in response to detecting no common mode transient event; and generate the differential signal using the first driver stage and the third driver stage in response to detecting a common mode transient event.

Clause 2: The circuit of clause 1, wherein the first driver stage is larger than the second driver stage, the first driver stage consumes more power than the second driver stage, and the first driver stage dissipates more heat than the second driver stage; and wherein the third driver stage is larger than the fourth driver stage, the third driver stage consumes more power than the fourth driver stage, and the third driver stage dissipates more heat than the fourth driver stage.

Clause 3: The circuit of clause 1 or 2, further comprising a common mode transient sensor configured to detect whether the common mode transient event exists or whether no common mode transient event exists.

Clause 4: The circuit of clause 3, further comprising a processor or logic unit, wherein the processor or the logic unit is configured to select either the first and third driver stages or the second and fourth driver stages based on output from the common mode transient sensor.

Clause 5: The circuit of clause 3 or 4, wherein the common mode transient sensor comprises a first set of PMOS and NMOS transistors, and a second set of PMOS and NMOS transistors, wherein each of the PMOS transistors is sized differently than each of the NMOS transistors and wherein relative sizes of the PMOS and NMOS transistors in the first set defines a high voltage reference point for the common mode transient sensor and relative sizes of the PMOS and NMOS transistors in the second set defines a low voltage reference point for the common mode transient sensor.

Clause 6: The circuit of clause 3 or 4, wherein the common mode transient sensor comprises a first set of PMOS and NMOS transistors, and a second set of PMOS and NMOS transistors, wherein the first set of PMOS and NMOS transistors are arranged and controlled to define a high voltage reference point the common mode transient sensor, and wherein the second set of PMOS and NMOS transistors are arranged and controlled to define a low voltage reference point the common mode transient sensor.

Clause 7: The circuit of clause 5 or 6, wherein the common mode transient sensor is configured to determine that the common mode transient event exists in response to detecting a voltage signal that is above the high voltage reference point or below the low voltage reference point.

Clause 8: The circuit of clause 7, wherein the voltage signal comprises a mid-voltage signal that is based on the first signal and the second signal that define the differential signal.

Clause 9: The circuit of any of clauses 1-8, wherein the circuit is a transmitter circuit, and the galvanic isolation barrier is defined by capacitors positioned between the transmitter circuit and a receiver circuit, wherein the differential signal is communicated thorough the capacitors from the transmitter circuit to the receiver circuit.

Clause 10: The circuit of any of clauses 1-9, wherein the first driver stage includes a first high side transistor and a first low side transistor, wherein the second driver stage includes a second high side transistor and a second low side transistor, wherein the third driver stage includes a third high side transistor and a third low side transistor, and wherein the fourth driver stage includes a fourth high side transistor and a fourth low side transistor.

Clause 11: A method comprising: outputting a first signal via a first driver circuit; and outputting a second signal via a second driver circuit, wherein the first signal and the second signal define a differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage, wherein the method includes: generating the differential signal using the second driver stage and the fourth driver stage in response to detecting no common mode transient event; and generating the differential signal using the first driver stage and the third driver stage in response to detecting a common mode transient event.

Clause 12: The method of clause 11, wherein the first driver stage is larger than the second driver stage, the first driver stage consumes more power than the second driver stage, and the first driver stage dissipates more heat than the second driver stage; and wherein the third driver stage is larger than the fourth driver stage, the third driver stage consumes more power than the fourth driver stage, and the third driver stage dissipates more heat than the fourth driver stage.

Clause 13: The method of clause 11 or 12, further comprising detecting whether the common mode transient event exists or whether no common mode transient event exists via a common mode transient sensor.

Clause 14: The method of clause 13, further comprising selecting either the first and third driver stages or the second and fourth driver stages based on output from the common mode transient sensor.

Clause 15: The method of clause 13 or 14, wherein the common mode transient sensor comprises a first set of PMOS and NMOS transistors, and a second set of PMOS and NMOS transistors, wherein each of the PMOS transistors is sized differently than each of the NMOS transistors so as to define a high voltage reference point and a low voltage reference point for the common mode transient sensor.

Clause 16: The method of clause 13 or 14, wherein the common mode transient sensor comprises a first set of PMOS and NMOS transistors, and a second set of PMOS and NMOS transistors, wherein the first set of PMOS and NMOS transistors are arranged and controlled to define a high voltage reference point the common mode transient sensor, and wherein the second set of PMOS and NMOS transistors are arranged and controlled to define a low voltage reference point the common mode transient sensor.

Clause 17: The method of clause 15 or 16, further comprising: determining that the common mode transient event exists in response to detecting a voltage signal that is above the high voltage reference point or below the low voltage reference point.

Clause 18: The method of claim 17, wherein the voltage signal comprises a mid-voltage signal that is based on the first signal and the second signal that define the differential signal.

Clause 19: The method of any of clauses 11-18, wherein the circuit is a transmitter circuit, wherein the galvanic isolation barrier is defined by capacitors positioned between the transmitter circuit and a receiver circuit, wherein the differential signal is communicated thorough the capacitors from the transmitter circuit to the receiver circuit.

Clause 20: The method of any of clauses 11-19, wherein the first driver stage includes a first high side transistor and a first low side transistor, wherein the second driver stage includes a second high side transistor and a second low side transistor, wherein the third driver stage includes a third high side transistor and a third low side transistor, and wherein the fourth driver stage includes a fourth high side transistor and a fourth low side transistor.

Clause 21: A system comprising: a transmitter circuit; a receiver circuit; and a plurality of capacitors that define a galvanic isolation barrier between the transmitter circuit and the receiver circuit, wherein the transmitter circuit is configured to generate a differential signal for communication over the galvanic isolation barrier, the transmitter circuit comprising: a first driver circuit configured to output a first signal, and a second driver circuit configured to output a second signal, wherein the first signal and the second signal define the differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage, wherein the transmitter circuit is configured to: generate the differential signal using the second driver stage and the fourth driver stage in response to detecting no common mode transient event; and generate the differential signal using the first driver stage and the third driver stage in response to detecting a common mode transient event.

Various examples of the disclosure have been described. These and other examples are within the scope of the following claims.

What is claimed is:

1. A circuit configured to generate a differential signal for communication over a galvanic isolation barrier, the circuit comprising:

a first driver circuit configured to output a first signal, and a second driver circuit configured to output a second signal, wherein the first signal and the second signal define the differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage, wherein the circuit is configured to:

generate the differential signal using the second driver stage and the fourth driver stage in response to detecting no common mode transient event; and generate the differential signal using the first driver stage and the third driver stage in response to detecting a common mode transient event.

2. The circuit of claim 1, wherein the first driver stage is larger than the second driver stage, the first driver stage consumes more power than the second driver stage, and the first driver stage dissipates more heat than the second driver stage; and wherein the third driver stage is larger than the fourth driver stage, the third driver stage consumes more power than the fourth driver stage, and the third driver stage dissipates more heat than the fourth driver stage.

3. The circuit of claim 1, further comprising a common mode transient sensor configured to detect whether the common mode transient event exists or whether no common mode transient event exists.

4. The circuit of claim 3, further comprising a processor or logic unit, wherein the processor or the logic unit is configured to select either the first and third driver stages or the second and fourth driver stages based on output from the common mode transient sensor.

5. The circuit of claim 3, wherein the common mode transient sensor comprises a first set of PMOS and NMOS transistors, and a second set of PMOS and NMOS transistors, wherein each of the PMOS transistors is sized differently than each of the NMOS transistors and wherein relative sizes of the PMOS and NMOS transistors in the first set defines a high voltage reference point for the common mode transient sensor and relative sizes of the PMOS and NMOS transistors in the second set defines a low voltage reference point for the common mode transient sensor.

6. The circuit of claim 3, wherein the common mode transient sensor comprises a first set of PMOS and NMOS transistors, and a second set of PMOS and NMOS transistors, wherein the first set of PMOS and NMOS transistors are arranged and controlled to define a high voltage reference point the common mode transient sensor, and wherein the second set of PMOS and NMOS transistors are arranged and controlled to define a low voltage reference point the common mode transient sensor.

7. The circuit of claim 6, wherein the common mode transient sensor is configured to determine that the common mode transient event exists in response to detecting a voltage signal that is above the high voltage reference point or below the low voltage reference point.

8. The circuit of claim 7, wherein the voltage signal comprises a mid-voltage signal that is based on the first signal and the second signal that define the differential signal.

9. The circuit of claim 1, wherein the circuit is a transmitter circuit, and the galvanic isolation barrier is defined by capacitors positioned between the transmitter circuit and a receiver circuit, wherein the differential signal is communicated thorough the capacitors from the transmitter circuit to the receiver circuit.

10. The circuit of claim 1, wherein the first driver stage includes a first high side transistor and a first low side transistor, wherein the second driver stage includes a second high side transistor and a second low side transistor, wherein the third driver stage includes a third high side transistor and a third low side transistor, and wherein the fourth driver stage includes a fourth high side transistor and a fourth low side transistor.

11. A method comprising:

outputting a first signal via a first driver circuit; and outputting a second signal via a second driver circuit, wherein the first signal and the second signal define a differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage, wherein the method includes:

generating the differential signal using the second driver stage and the fourth driver stage in response to detecting no common mode transient event; and generating the differential signal using the first driver stage and the third driver stage in response to detecting a common mode transient event.

12. The method of claim 11, wherein the first driver stage is larger than the second driver stage, the first driver stage consumes more power than the second driver stage, and the first driver stage dissipates more heat than the second driver stage; and wherein the third driver stage is larger than the fourth driver stage, the third driver stage consumes more power than the fourth driver stage, and the third driver stage dissipates more heat than the fourth driver stage.

13. The method of claim 11, further comprising detecting whether the common mode transient event exists or whether no common mode transient event exists via a common mode transient sensor.

14. The method of claim 13, further comprising selecting either the first and third driver stages or the second and fourth driver stages based on output from the common mode transient sensor.

15. The method of claim 13, wherein the common mode transient sensor comprises a first set of PMOS and NMOS transistors, and a second set of PMOS and NMOS transistors, wherein each of the PMOS transistors is sized differently than each of the NMOS transistors so as to define a high voltage reference point and a low voltage reference point for the common mode transient sensor.

16. The method of claim 13, wherein the common mode transient sensor comprises a first set of PMOS and NMOS transistors, and a second set of PMOS and NMOS transistors, wherein the first set of PMOS and NMOS transistors are arranged and controlled to define a high voltage reference point the common mode transient sensor, and wherein the second set of PMOS and NMOS transistors are arranged and controlled to define a low voltage reference point the common mode transient sensor.

17. The method of claim 16, further comprising:

determining that the common mode transient event exists in response to detecting a voltage signal that is above the high voltage reference point or below the low voltage reference point.

18. The method of claim 17, wherein the voltage signal comprises a mid-voltage signal that is based on the first signal and the second signal that define the differential signal.

19. The method of claim 11, wherein the circuit is a transmitter circuit, wherein a galvanic isolation barrier is defined by capacitors positioned between the transmitter circuit and a receiver circuit, wherein the differential signal is communicated thorough the capacitors from the transmitter circuit to the receiver circuit.

20. The method of claim 11, wherein the first driver stage includes a first high side transistor and a first low side transistor, wherein the second driver stage includes a second high side transistor and a second low side transistor, wherein the third driver stage includes a third high side transistor and a third low side transistor, and wherein the fourth driver stage includes a fourth high side transistor and a fourth low side transistor.

21. A system comprising:

a transmitter circuit;

a receiver circuit; and a plurality of capacitors that define a galvanic isolation barrier between the transmitter circuit and the receiver circuit, wherein the transmitter circuit is configured to generate a differential signal for communication over the galvanic isolation barrier, the transmitter circuit comprising:

a first driver circuit configured to output a first signal, and a second driver circuit configured to output a second signal, wherein the first signal and the second signal define the differential signal, wherein the first driver circuit includes a first driver stage and a second driver stage, wherein an output impedance of the first driver stage is lower than an output impedance of the second driver stage, wherein the second driver circuit includes a third driver stage and a fourth driver stage, wherein an output impedance of the third driver stage is lower than an output impedance of the fourth driver stage, wherein the transmitter circuit is configured to:

generate the differential signal using the second driver stage and the fourth driver stage in response to detecting no common mode transient event; and generate the differential signal using the first driver stage and the third driver stage in response to detecting a common mode transient event.

* * * * *